US010562054B2

(12) United States Patent
Schoen et al.

(10) Patent No.: US 10,562,054 B2
(45) Date of Patent: Feb. 18, 2020

(54) AUTOMATICALLY CONTROLLING A LIQUID SPRAY PATTERN

(71) Applicant: Precision Valve & Automation, Inc., Cohoes, NY (US)

(72) Inventors: Jason Schoen, Clifton Park, NY (US); John Urquhart, Saratoga Springs, NY (US); Ryan Lindbom, Albany, NY (US); Anthony Pecorino, Cohoes, NY (US); Diana Polli, Cohoes, NY (US)

(73) Assignee: PRECISION VALVE & AUTOMATION, INC., Cohoes, NY (US)

( * ) Notice: Subject to any disclaimer, the term of this patent is extended or adjusted under 35 U.S.C. 154(b) by 63 days.

(21) Appl. No.: 15/410,115

(22) Filed: Jan. 19, 2017

(65) Prior Publication Data

US 2017/0259289 A1  Sep. 14, 2017

Related U.S. Application Data

(60) Provisional application No. 62/306,753, filed on Mar. 11, 2016.

(51) Int. Cl.
*B05B 12/08* (2006.01)
*B05B 14/00* (2018.01)
*H05K 3/00* (2006.01)

(52) U.S. Cl.
CPC ............ *B05B 12/082* (2013.01); *B05B 14/00* (2018.02); *H05K 3/0085* (2013.01); *H05K 2203/075* (2013.01); *H05K 2203/163* (2013.01)

(58) Field of Classification Search
None
See application file for complete search history.

(56) References Cited

U.S. PATENT DOCUMENTS 5,312,039 A    5/1994  Sayka et al.
6,457,655 B1 * 10/2002  Reighard ................. B05B 1/04
                                                            239/8

(Continued)

FOREIGN PATENT DOCUMENTS

CN      204911886 U    12/2015
DE       19727484 A1    2/1999

(Continued)

OTHER PUBLICATIONS

European Search Report and Written Opinion for European Application No. 17 15 5676, completed on Jul. 3, 2017.

*Primary Examiner* — Michael P. Rodriguez
(74) *Attorney, Agent, or Firm* — Schmeiser, Olsen & Watts, LLP

(57) ABSTRACT

A dispensing control system, including a frame component having a first side surface and a second side surface, a first sensor portion positioned proximate the first side surface, and a second sensor portion positioned proximate the second side surface, the second sensor portion being separated from the first sensor portion a distance to allow a liquid spray stream exiting a dispenser of a conformal coating machine to pass therebetween, wherein the first sensor portion transmits a beam of light towards the second sensor portion to measure the liquid spray stream exiting the dispenser, the beam of light encompassing both edges of the liquid spray stream while the dispenser is stationary, is provided. Furthermore, an associated method is also provided.

8 Claims, 4 Drawing Sheets

(56) References Cited

U.S. PATENT DOCUMENTS

| | | | |
|---|---|---|---|
| 2007/0251921 A1 | 11/2007 | Herchen | |
| 2009/0000391 A1 | 1/2009 | Dorrmann et al. | |
| 2009/0197008 A1 | 8/2009 | Kawakami | |
| 2014/0061329 A1* | 3/2014 | Ngo | B05B 9/06 239/11 |
| 2014/0263720 A1* | 9/2014 | Travaglini | B05B 1/30 239/69 |
| 2014/0367483 A1* | 12/2014 | Jackson | B05B 12/082 239/11 |

FOREIGN PATENT DOCUMENTS

| | | |
|---|---|---|
| DE | 19727484 C2 | 2/2001 |
| EP | 1080787 A2 | 3/2001 |
| EP | 2954956 A1 | 12/2015 |
| EP | 2960006 A1 | 12/2015 |
| EP | 3216526 A1 | 9/2017 |
| JP | 2009128209 A | 6/2009 |
| JP | 2014081306 A | 5/2014 |
| WO | 01 97983 A1 | 12/2001 |

* cited by examiner

AUTOMATICALLY CONTROLLING A LIQUID SPRAY PATTERN

CROSS-REFERENCE TO RELATED APPLICATIONS

This application claims priority to and the benefit of U.S. Provisional Application No. 62/306,753, filed Mar. 11, 2016, and entitled, "Method and Apparatus For Automatically Controlling a Liquid Spray Pattern."

FIELD OF TECHNOLOGY

The following relates to liquid dispensing systems and more specifically to embodiments of automatically controlling a liquid spray pattern.

BACKGROUND

Machines exist to apply conformal coating to various substrates, such as a printed circuit board. Conformal coating may be applied by a dispenser in a fan-like pattern. The fan-like spray patterns of the conformal coating are typically programmed for a specific application. An actual spray pattern width that matches a programmed spray pattern width is critical to the success of the application of conformal coating to a substrate. Methods exist to measure the spray pattern width, but involve moving the dispenser, which adds precious time to the application, requires additional programming, and wastes additional material.

Thus, a need exists for an apparatus and method for automatically controlling a liquid spray pattern, while reducing movement of the dispenser to obtain the actual width of the spray pattern.

SUMMARY

A first aspect relates generally to a dispensing control system, comprising: a frame component having a first side surface and a second side surface, a first sensor portion positioned proximate the first side surface, and a second sensor portion positioned proximate the second side surface, the second sensor portion being separated from the first sensor portion a distance to allow a liquid spray stream exiting a dispenser of a conformal coating machine to pass therebetween, wherein the first sensor portion transmits a beam of light towards the second sensor portion to measure the liquid spray stream exiting the dispenser, the beam of light encompassing both edges of the liquid spray stream while the dispenser is stationary.

A second aspect relates generally to a conformal coating machine having a dispensing control system for controlling a width of a spray pattern exiting a dispenser, the dispensing control system comprising: a sensor having a first sensor portion and a second sensor portion coupled to a frame component within the conformal coating machine, and at least one adjustment component in operable communication with the dispenser, wherein the spray pattern exiting the dispenser is measured by the sensor to compare with a desired spray pattern, the measurement occurring without moving the dispenser.

A third aspect relates generally to a method of automatically controlling a liquid spray pattern, comprising: initializing a dispenser of a dispensing system, emitting a beam of light from a sensor coupled to a frame component within a conformal coating machine, measuring an actual width of the liquid spray pattern exiting the dispenser using the beam of light emitted by the sensor, comparing the actual width of the liquid spray pattern with a desired width of the liquid spray pattern, determining that the actual width of the spray pattern is different than the desired width of the liquid spray pattern, and adjusting a width of the liquid spray pattern in response to the determining so that the actual width of the liquid spray pattern corresponds within a range of tolerance to the desired liquid spray pattern, wherein the dispenser remains stationary during the method.

The foregoing and other features of construction and operation will be more readily understood and fully appreciated from the following detailed disclosure, taken in conjunction with accompanying drawings.

BRIEF DESCRIPTION OF THE DRAWINGS

Some of the embodiments will be described in detail, with reference to the following figures, wherein like designations denote like members, wherein.

DETAILED DESCRIPTION

A detailed description of the hereinafter described embodiments of the disclosed apparatus and method are presented herein by way of exemplification and not limitation with reference to the Figures. Although certain embodiments are shown and described in detail, it should be understood that various changes and modifications may be made without departing from the scope of the appended claims. The scope of the present disclosure will in no way be limited to the number of constituting components, the materials thereof, the shapes thereof, the relative arrangement thereof, etc., and are disclosed simply as an example of embodiments of the present disclosure.

As a preface to the detailed description, it should be noted that, as used in this specification and the appended claims, the singular forms "a", "an" and "the" include plural referents, unless the context clearly dictates otherwise.

Figure 1A:
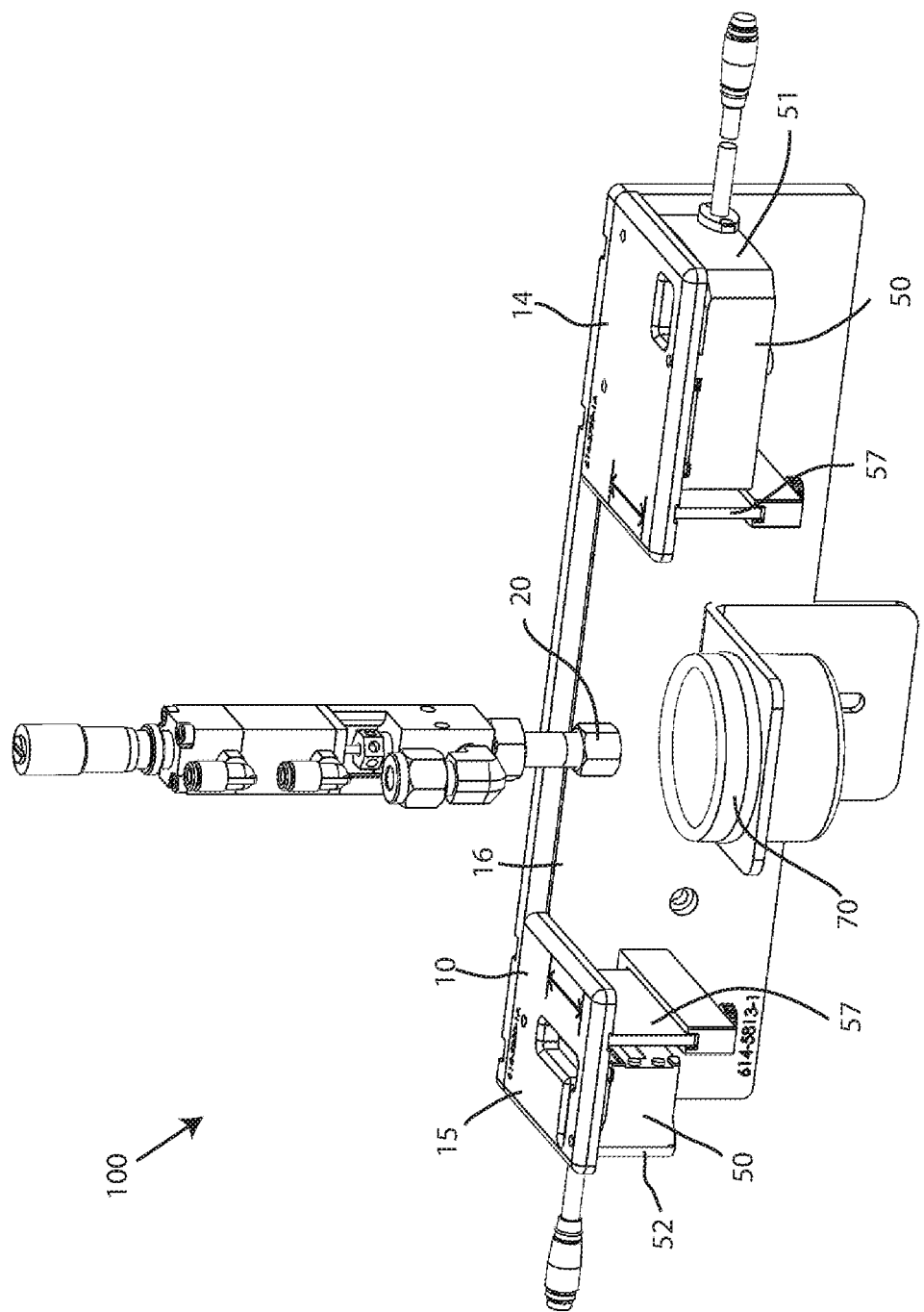
FIG. 1A depicts a perspective view of an embodiment of a dispensing system.
Figure 1B:
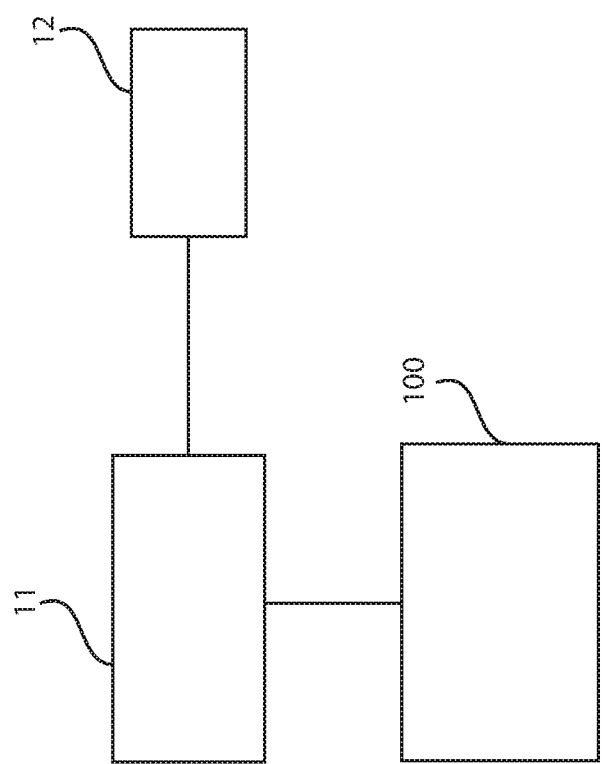
FIG. 1B depicts a schematic diagram of an embodiment of the dispensing system.

Referring to the drawings, FIGS. 1A and 1B depict embodiments of a dispensing control system 100. Embodiments of the dispensing control system 100 may be part of a conformal coating machine, wherein a conformal coating is applied to a substrate, such as a printed circuit board. For example, embodiments of the dispensing control system 100 may be operably attached to a robot, such as a gantry robot, wherein the movement of a dispenser, such as dispenser 20, of the dispensing control system 100 is computer programmable. Embodiments of the dispensing control system 100 may be a liquid dispensing control and/or adjustment system, a conformal coating dispenser controlling system, a liquid spray dispensing controller, and the like. As shown in FIG. 1B, embodiments of the dispensing control system 100 may be operably connected to a regulator 11 and a fluid supply 12. In an exemplary embodiment, the regulator 11 and the fluid supply 12 are in fluid communication with the dispensing assembly, which includes dispenser 20. These components may also be mechanically connected in a manner that facilitates the dispensing and regulating of a fluid from the dispenser of the dispensing system 100. The regulator 11 may control, adjust, regulate, etc. a pressure of fluid material existing the dispenser 20, as measured by dispensing control system 100. Embodiments of the regulator 11 may be a pneumatically controlled regulator. In an exemplary embodiment, regulator 11 may be an electropneumatical regulator 11. Further, a pump may be associated with the fluid supply 12, wherein the pump may be operated to effectuate a change in pump output. For instance, a pump, such as a gear pump, may be used to increase or decrease a pump speed through the dispenser, as measured by dispensing control system 100.

Moreover, embodiments of the dispensing control system 100 may include a frame component 10, a dispenser 20, a stroke adjuster 40, a sensor 50, and receptacle 70.

Embodiments of the dispensing control system 100 may include a frame component 10. Embodiments of the frame component 10 may include a first surface 14 and a second surface 15, wherein the first surface 14 and the second surface 15 may be separated by a gap. The gap may be an opening, a space, and the like that may be sized and dimensioned so that the dispenser 20 may fit therebetween. The first surface 14 and the second surface 15 may be a shelf-like lip that extends from a back member 16 of the frame component 10. Embodiments of the frame component 10 may be a bracket component for mounting to the dispensing control system 100. The sensor 50 may also be mounted to the frame component 10. For instance, embodiments of the sensors 50 may be mounted to or otherwise coupled to an underside of the shelves 14, 15. Each of the first surface 14 and the second surface 15 may include one or more openings 17 that may provide access to the sensor, which may allow an operator to interface with the sensor 50, such as a switch, access panel, etc. Alternatively, embodiments of the one or more openings 17 on the first surface 14 and the second surface 15 may be a window to view information displayed by the sensor 50. Furthermore, embodiments of the first surface 14 and the second surface 15 of the frame component 10 may include guiding indicia 18 that may assist the positioning the dispenser 20 within a width of the light beam emitted by the sensor 50. For example, an operator may use the guiding indicia 18 to correctly position the dispenser 20 between the guiding indicia 18 to ensure that the light beam emitted by the sensor 50 can encompass the width of a spray exiting the dispenser 20. In other embodiments, a computer programmable robot moving the dispenser 20 into a particular coordinate for testing the spray width (or applying the liquid spray to a printed circuit board) may use one or more sensors to capture the guiding indicia 18 to verify that the coordinates input into the computer for placement of the dispenser 20 are accurate.

Referring still to FIGS. 1A and 1B, embodiments of the dispensing control system 100 may include a dispenser 20. Embodiments of the dispenser 20 may be in fluid communication with the fluid supply 12. The dispenser 20 may include a nozzle for dispensing a liquid onto a substrate, such as a printed circuit board. In an exemplary embodiment, the dispenser 20 may be a spray head. The dispenser 20 may be moved along the X-axis, Y-axis, and Z-axis by a robot to dispense the liquid spray at desired areas of the substrate. Further, the dispenser 20 may be moved or otherwise positioned proximate the frame component 10 and the sensors 20 to dispense a liquid into the receptacle 70 for adjustment/control of the liquid spray pattern. Liquid being dispensed from the dispenser 20 may be in a pattern. The pattern may be a liquid spray pattern. The spray pattern may be a fan, or fan-like pattern. The dispensing pattern of the liquid may have a width when dispensed from the dispenser 20. Moreover, embodiments of the dispensing system 100 may include a stroke adjuster 40. Embodiments of the stroke adjuster 40 may adjust a size of an orifice of the dispenser 20. In other words, the stroke adjuster 40 may adjust, change, reduce, enlarge, etc., an area of the opening of the dispenser 20 where the dispensing fluid exits the dispenser 20. In some embodiments, the stroke adjuster 40 may be adjusted, controlled, etc. manually. In further embodiments, the stroke adjuster 40 may be automatically controlled via a servo motor and a liner actuator, coupled to a controller or computer processor.

Furthermore, embodiments of a dispensing control system 100 may include a receptacle 70. Embodiments of a receptacle 70 may be coupled to the frame component 10 between the first surface 14 and the second surface 15. The receptacle 70 may be mounted to the back member 16 of the frame component via an L-shaped or right angle bracket. In some embodiments, the receptacle 70 may be directly coupled to the back member 16 of the frame component 10. In an exemplary embodiment, the receptacle 70 may be coupled to the frame component such that the dispenser 70 is positioned below the dispenser 20 when the dispenser 20 is moved into position to collect dispensed fluid. Embodiments of the receptacle 70 may be a drain pan, a collection pan, a pan, a drain cup, a collection cup, a well, a recessed chamber, a pot, a cup, a basin, or any container capable of collecting and retaining a dispensed fluid. The receptacle 70 may also have a drain line attached thereto for draining the collection cup after a certain amount of liquid spray has been dispensed into the receptacle 70. Embodiments of the receptacle 70 may be configured to collect fluid dispensed during a measurement and adjustment procedure as described in great detail infra. In particular, the receptacle 70 may collect fluid dispensed when determining whether an actual width of the spray pattern corresponds to a desired, pre-programmed pattern for a desired application. During this procedure, a target, such as a PCB or other substrate may not be positioned along frame component 10, so that the fluid passes into the receptacle 70 for easy cleaning of a machine. In alternative embodiments, the dispenser 20 may be dispensing liquid spray onto targets at a different location of the conformal coating machine, and may be brought into proximity with the frame component 10 for testing/verifying that the actual width of the spray pattern corresponds to the programmed spray pattern width.

With continued reference to FIG. 1A, embodiments of the dispensing system 100 may include a sensor(s) 50. Embodiments of sensor 50 may measure one or more characteristics of the spray pattern of the fluid dispensed from the dispenser 20. For example, the sensor 50 may measure a width of the liquid spray pattern. Embodiments of the sensor 50 may be communicatively coupled to a computing system of the conformal coating machine, or an onboard computer positioned on the frame component 10, to communicate the results obtained by the sensor 50, via a communication network or serial bus line(s). The sensor 50 may include a transmitter 51 and a receiver 52. The transmitter 51 may face the receiver 52, wherein the transmitter emits a beam or path of light towards the receiver 52. The transmitter 51 of the sensor 50 may be disposed on a first side of the liquid spray exiting the dispenser 20, while the receiver 52 may be disposed on an opposing, second side of the liquid spray exiting the dispenser 20. In an exemplary embodiment, the transmitter 51 of the sensor 50 may be disposed underneath the first surface 14 of the frame component 10, residing proximate or touching the back member 16 of the frame member 10. Likewise, the receiver 52 may be disposed underneath the second surface 15 of the frame component 10, residing proximate or touching the back member 16 of the frame member 10. This arrangement may be reversed, such that the transmitter 51 resides beneath the second surface 15, while the receiver 52 resides beneath the first surface 14. A window 57, such as a glass insert or other optically transparent surface, may be disposed in front of the transmitter 51 and receiver 51 to protect the sensor 50 components from splashing of the liquid spray, dust, debris, and the like. Furthermore, embodiments of the sensor 50 may be a digital laser sensor, a laser measurement sensor, a laser through-beam sensor, a laser CCD micrometer, and the like. Embodiments of the transmitter 51 may transmit, emit, direct, or otherwise cause a light beam to travel towards the receiver 52 along a horizontal path, parallel to the frame component 10. The beam of light, such as a flat laser beam, may be caused to pass through the liquid spray pattern dispensed by the dispenser to measure characteristics of the dispensed liquid.

Figures 2, 3:
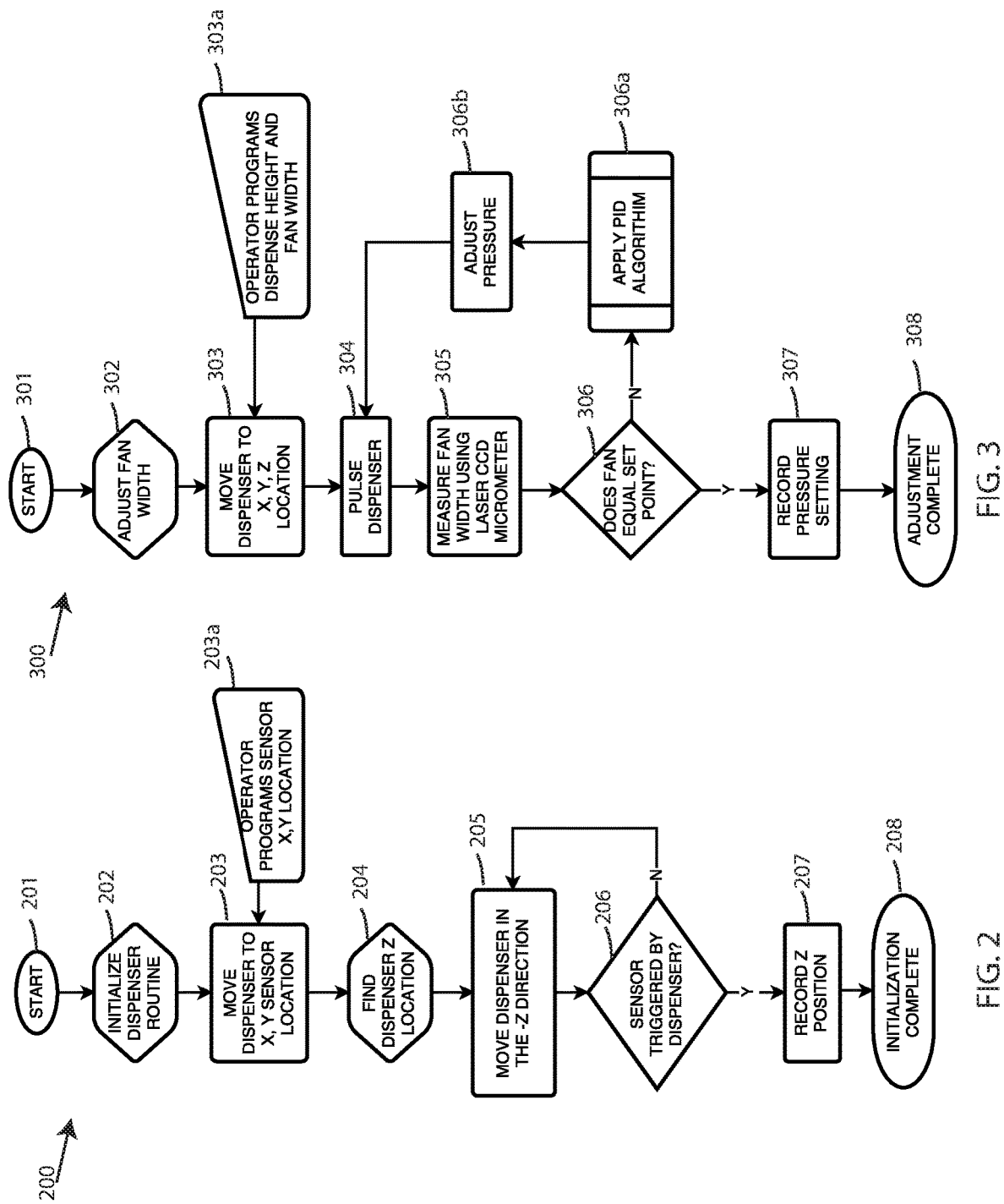
FIG. 2 depicts a flowchart depicting a method of initializing the dispenser.
FIG. 3 depicts a flowchart depicting a method of controlling/adjusting spray pattern width.

With additional reference to FIGS. 2-3, an initialization method 200 and adjustment method 300 may now be described. The dispensing control system 100 may be initialized according to a particular method 200, as depicted in FIG. 2. For instance, the initialization method 200 may begin with s moving the dispenser 20 into a location for measurement and adjustment of a spray pattern (if needed). After initialization, an adjustment method 300 may be implemented to automatically control the width of the spray pattern, as depicted in FIG. 3.

Referring now to FIG. 2, embodiments of an initialization step may include the following steps. First, step 201 stats the initialization method 200 to initialize a dispenser routine, shown at step 202. The dispenser routine may be preprogrammed by an operator, and may vary depending on the desired application, fluid used, substrate conditions, etc. Once the dispenser routine is initialized, the dispenser 20 may be moved to a location. The location may be a X, Y sensor location. Further, the location may be a location along an X or Y-axis. An operator may program that location, shown at step 203a. Next, a Z-axis location of the dispenser 20 is found at step 204, and then the dispenser 20 may be moved along the Z-axis at step 205. The dispenser 20 may be moved along the Z-axis until the sensor 50 (or a separate sensor) is triggered by a presence of the dispenser 20, shown at step 206. Once the dispenser 20 no longer needs to be moved along the Z-axis, the Z position is recorded at step 207. The initialization method 200 may be complete after the Z position is recorded, shown at step 208.

In response to the completion of the initialization method 200, a method for automatically controlling a liquid spray pattern may be implemented. The method 300 may be implemented without first performing the initialization method 200. Method 300 may be started, at step 301, to adjust the spray pattern fan width, at step 302. At step 303, the dispenser 20 may be further moved to a X, Y, Z location; however, the dispenser 20 may not need to be moved from the position determined by the initialization step. At this point, at step 303a, or any point prior, an operator may program, input, enter, etc. dispense height and fan width information into a computing device coupled to the dispensing control system 100. For instance, an operator may program desired spray pattern information, such as the desired height and width of the liquid exiting the dispenser 20 and contacting a substrate, such as a PCB. The spray pattern information may relate to a width of the stream of liquid exiting the dispenser 20, and may also relate to a desired height of the fluid when disposed on the substrate. Accordingly, the desired spray pattern characteristics may be defined herein as a desired spray pattern.

Furthermore, while the dispenser 20 does not move, the dispenser 20 may be pulsed to dispense an amount of the liquid, shown at step 305. In other words, the dispenser 20, and the end effector coupled to the dispenser 20 or dispending head/base, may remain stationary as the liquid spray is measured by the sensor 50. The spray pattern of the liquid being dispensed from the dispenser 20 during implementation of the method 300 may be defined as an actual spray pattern. To ensure that the actual spray pattern matches, corresponds to, or is within a tolerable range of the desired spray pattern, the liquid stream may be measured, depicted at step 305.

Figure 4:
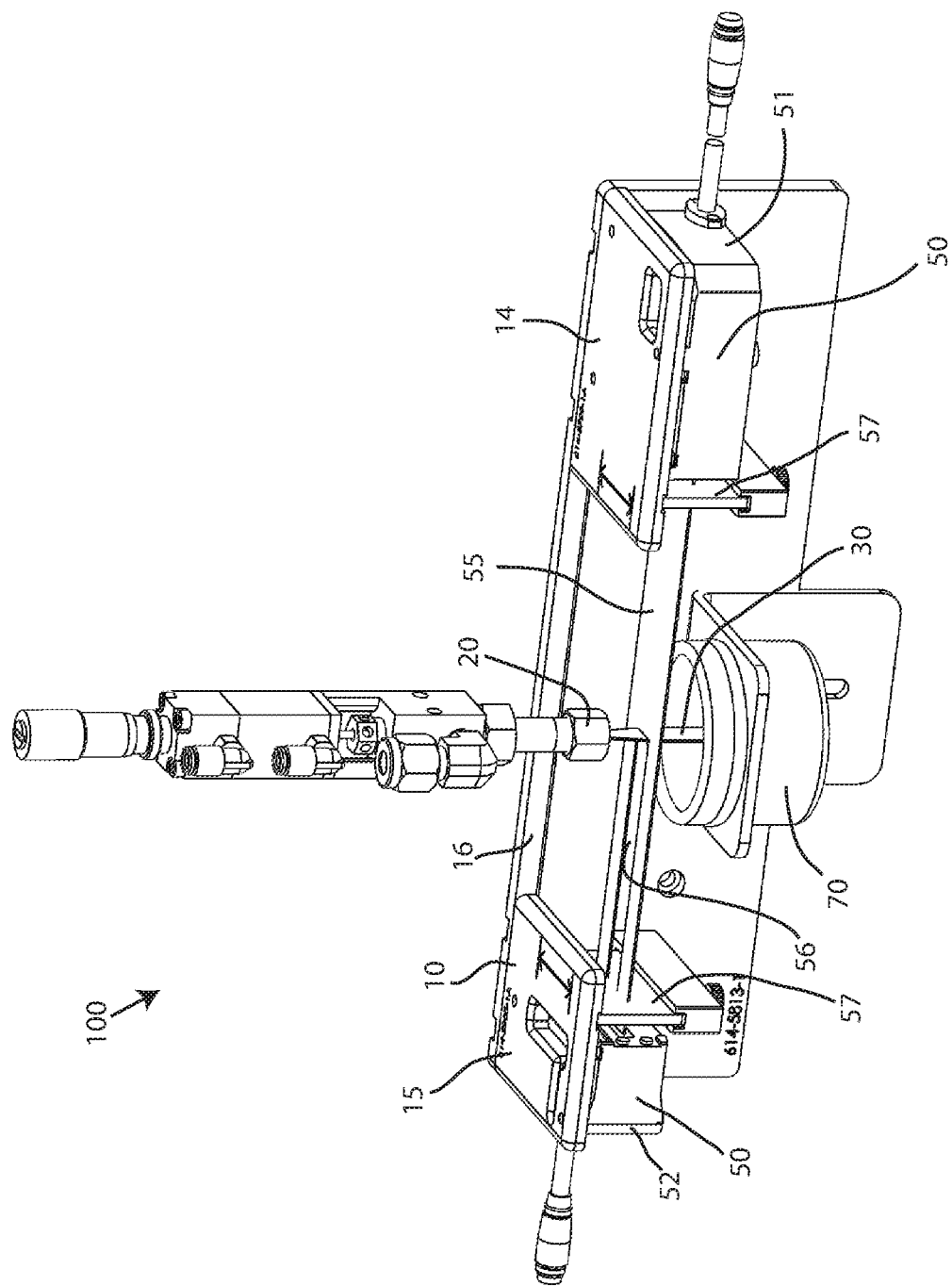
FIG. 4 depicts a perspective view of the dispensing system, wherein a spray pattern width is being measured.

The measurement may be carried out by sensor 50. With additional reference to FIG. 4, the actual pattern may be measured by sensor 50. In particular, the transmitter 51 of the sensor 50 may emit a beam of light 55, such as a multi-wavelength laser towards the receiver 51, which is located on separate side of the frame component 10. The beam 55 may have a precisely accurately determined width, which can be larger than a width of the dispensed liquid stream 30 exiting the dispenser 20. The liquid being dispensed from the dispenser 20 while the dispenser does not move, may pass through the beam 55 of sensor 50, as shown in FIG. 4. The area depicted by 56 represents light that is not received by the receiver 52 due to presence of the liquid pattern 30 in the beam 55. The sensor 50 may calculate the width of the received portion of light from the transmitter 51 to the receiver 51 to determine an actual width of the spray pattern 30. Thus, a width of the laser-free area 56 may be determined to be an actual width of the liquid spray pattern 30 of the dispenser 20.

At step 306 of the method 300, the actual spray pattern 30 is compared to the desired spray pattern. For example, a processor of a computing system coupled to the dispensing control system 100 and/or a processor of a computing system associated with the conformal coating machine containing the dispensing control system 100 components may compare the data received from the sensor 50 (e.g. a mathematical number representing a physical measurement of a width of the liquid spray pattern 30) with a value entered/input/programmed into the computing device as a desired width for a particular application. If the actual width does not equal the desired width (or within an acceptable tolerance from the desired width), then the processor carries out a fluid flow rate adjustment step in accordance with an algorithm configured to adjust a fluid flow rate, shown at step 306a. Step 306a includes adjusting the fluid flow rate, if needed, to bring the actual spray width closer to the desired spray width. Adjusting the fluid flow rate may be accomplished automatically by manipulating, actuating, controlling, and the like, at least one adjustment component. The at least one adjustment component may be a regulator 11, a pump, or a stroke adjuster 40. In one embodiment, the fluid flow rate of the spray pattern 30 may be adjusted by adjusting, controlling, changing, etc., a pressure. Pressure may be adjusted and/or regulated by the regulator 11 operably connected to the dispensing system 100. The pressure may be adjusted so as to reduce or increase a width of the spray pattern to bring the actual spray pattern closer to the desired spray pattern. In another embodiment, the fluid flow rate of the liquid stream 30 may be adjusted by increasing a pump speed. The pump speed may be increased by the pump, such as a gear pump, associated with the fluid supply 12, wherein the speed or velocity of the fluid exiting the dispenser 20 is increased. In yet another embodiment, the fluid flow rate of the dispensed fluid 30 may be adjusted by adjusting, changing, reducing, enlarging, etc., an orifice of the dispenser 20. The orifice of the dispenser 20 may be adjusted by the stroke adjuster 40. Once the actual spray pattern equals, or is within an acceptable tolerance, the pressure is recorded at step 307, and the adjustment method 300 may be complete 300. Accordingly, a liquid spray pattern may be automatically controlled.

During the measurement step described in method 300, the dispenser 20 may not move, and remain stationary. Due to the position and type of the sensor 50, the dispenser 20 does not need to be adjusted or moved while the dispensed liquid passes through the beam 55 of the sensor 50. In other words, the spray pattern characteristics, such as the width, are determined/measured by a sensor, such as sensor 50, without having to move the dispenser 20 (or the liquid stream 30). An entire width of the liquid spray pattern 30 may be detected and measured by a single pass of the beam 55, such that the no movement along the X, Y, or Z axis is required by either the frame component 10 or the dispenser 20 or the end effector coupled to the dispenser 20. If the liquid spray pattern 30 is fan-like, the edges of the fan-like spray pattern may be encompassed by the single beam 55, without having to displace the dispenser 20. Accordingly, embodiments of the dispensing control system 100 may measure an actual spray pattern, verify/compare the actual spray pattern with a desired or preprogrammed spray pattern, and adjust various components to affect or control the liquid spray pattern, while the end effector, valve head and/or dispenser 20 remain stationary. Both edges of the liquid spray stream 30 may be measured by a light source without having to move the nozzle of the dispenser 20, or the dispenser 20. In other words, both the sensor 50 and the dispenser 20 may be stationary to perform the measurement of the liquid spray pattern 30, saving precious time to the application, reduces programming of the conformal coating machine, and saves additional material.

While this disclosure has been described in conjunction with the specific embodiments outlined above, it is evident that many alternatives, modifications and variations will be apparent to those skilled in the art. Accordingly, the preferred embodiments of the present disclosure as set forth above are intended to be illustrative, not limiting. Various changes may be made without departing from the spirit and scope of the invention, as required by the following claims. The claims provide the scope of the coverage of the invention and should not be limited to the specific examples provided herein.

What is claimed is:

1. A method of automatically controlling a liquid spray pattern, comprising:

initializing a dispenser of a dispensing system;

emitting a beam of light from a transmitter of a sensor coupled to a frame component within a conformal coating machine, the beam of light having a width greater than an actual width of the liquid spray pattern;

measuring the actual width of the liquid spray pattern exiting the dispenser based on light not received by a receiver of the sensor;

comparing the actual width of the liquid spray pattern with a desired width of the liquid spray pattern;

determining that the actual width of the spray pattern is different than the desired width of the liquid spray pattern; and adjusting a width of the liquid spray pattern in response to the determining so that the actual width of the liquid spray pattern corresponds within a range of tolerance to the desired liquid spray pattern;

wherein the dispenser and the sensor remain stationary during the measuring.

2. The method of claim 1, wherein adjusting comprises at least one adjustment component adjusting a fluid flow rate of the dispensed liquid.

3. The method of claim 2, wherein the at least one adjustment component is a regulator, a pump, or a stroke adjuster.

4. The method of claim 1, wherein adjusting comprises at least one adjustment component manipulating an area of an orifice of the dispenser to control the width of the spray pattern.

5. The method of claim 1, wherein measuring comprises detecting an entire width of the liquid spray stream with a single pass of the beam of light emitted by the sensor.

6. The method of claim 1, wherein a processor of a computing device associated with the conformal coating machine implements the method.

7. A method comprising:

initializing a dispenser of a liquid dispensing system so that a liquid is dispensed in a liquid spray pattern; and emitting a beam of light having a width greater than a width of the liquid spray pattern from a transmitter of a laser sensor coupled to a frame component within the liquid dispensing system to measure the width of the liquid spray pattern based on light not received by a receiver of the laser sensor, wherein a portion of the beam of light contacts the liquid spray pattern across the width of the liquid spray pattern continuously from a first edge to a second edge of the liquid spray pattern so that the portion of the beam of light contacting the liquid spray pattern is not received by the receiver, thereby defining an actual width of the liquid spray pattern;

wherein, as a result of the emitting, the width of the liquid spray pattern is adjusted.

8. The method of claim 7, wherein the dispenser and the laser sensor remain stationary during the emitting.

* * * * *